(12) United States Patent
Quevedo-Lopez et al.

(10) Patent No.: US 6,933,235 B2
(45) Date of Patent: Aug. 23, 2005

(54) METHOD FOR REMOVING CONTAMINANTS ON A SUBSTRATE

(75) Inventors: Manuel A. Quevedo-Lopez, Denton, TX (US); Robert M. Wallace, Richardson, TX (US); Mohamed El Bouanani, Denton, TX (US); Bruce E. Gnade, Lewisville, TX (US)

(73) Assignee: The Regents of the University of North Texas, Denton, TX (US)

( * ) Notice: Subject to any disclaimer, the term of this patent is extended or adjusted under 35 U.S.C. 154(b) by 0 days.

(21) Appl. No.: 10/302,714

(22) Filed: Nov. 21, 2002

(65) Prior Publication Data

US 2004/0102009 A1 May 27, 2004

(51) Int. Cl.$^7$ ............................................. H01L 21/302
(52) U.S. Cl. ........................ 438/694; 438/706; 438/723
(58) Field of Search ................................ 438/694, 706, 438/723, 906, 516, 287, 216, 261, 284, 722, 756

(56) References Cited

U.S. PATENT DOCUMENTS

| | | | | |
|---|---|---|---|---|
| 5,656,852 A | * | 8/1997 | Nishioka et al. | 257/632 |
| 6,066,572 A | * | 5/2000 | Lu et al. | 438/774 |
| 6,291,283 B1 | * | 9/2001 | Wilk | 438/216 |
| 6,368,949 B1 | * | 4/2002 | Chen et al. | 438/592 |
| 6,475,927 B1 | * | 11/2002 | Thakur | 438/773 |
| 6,818,493 B2 | * | 11/2004 | Hobbs et al. | 438/216 |
| 2002/0146888 A1 | * | 10/2002 | Ryu et al. | 438/300 |

OTHER PUBLICATIONS

Ghandhi, Sorab K, VLSI Fabrication Principles Silicon and Gallium Arsenide, 1983 John Wiley and Sons, pp. 517–518.*

Ghandhi, Sorab K.; VLSI Fabrication Principles: Silicon and Gallium Arsenide; 1983; John Wiley and Sons; pp. 517–518.*

* cited by examiner

*Primary Examiner*—George Fourson
*Assistant Examiner*—Julio J. Maldonado
(74) *Attorney, Agent, or Firm*—David J. Aston; Peters, Verny, Jones, Schmitt & Aston, LLP

(57) ABSTRACT

A method of processing a substrate is disclosed. The method includes depositing a dielectric layer having a metal oxide on a substrate. A portion of the dielectric layer is removed to form a dielectric structure, thereby exposing a surface of the substrate. For example, the dielectric layer may be patterned using standard photolithographic techniques and etching. An oxide layer is then formed on the exposed surface of the substrate. The oxide layer may be formed using ozone that is generated using ultraviolet radiation. After the oxide layer is formed, it is removed using an etching process.

14 Claims, 4 Drawing Sheets

METHOD FOR REMOVING CONTAMINANTS ON A SUBSTRATE

BACKGROUND OF THE INVENTION

The area of advanced gate dielectrics has gained considerable attention recently, because technology roadmaps predict the need for a sub-2.0 nanometer $SiO_2$ gate dielectric for sub-0.13 micron complementary metal-oxide-semiconductor (CMOS) technology. There are leakage current and reliability concerns, however, for $SiO_2$ in this thickness regime.

In response to the need to find replacements for $SiO_2$, different materials are being evaluated as possible substitutes for $SiO_2$ as a gate dielectric material. For example, $HfSi_xO_y$ and $ZrSi_xO_y$ are two of the promising high-κ gate dielectric candidates which are expected to meet the need for sub 2.0 nanometer gate dielectrics for sub-0.13 micron scaled silicon CMOS. However, the stability of the ($HfSi_xO_y$, $ZrSi_xO_y$)/silicon interface following dopant activation annealing remains one of the most important issues to be resolved. Dopant activation annealing for short durations (<30 sec) at 1050° C. can result in undesirable properties, including: interfacial layer growth, microstructural changes in the film, and possible metal outdiffusion from the gate dielectric into the transistor channel region. Metal incorporation into the channel region is likely to affect the electrical behavior of silicon-based CMOS transistors, since it is well known that CMOS device performance is sensitive to impurities in the channel region of the transistor. Substantial metal (Zr or Hf) incorporation into the channel region of the transistor is expected to decrease the electrical performance of silicon-based CMOS transistors, mostly due to deleterious effects on carrier mobility.

Embodiments of the invention address the above problem and other problems.

SUMMARY OF THE INVENTION

Embodiments of the invention are directed to methods of processing a substrate to remove contaminants from a substrate.

One embodiment of the invention is directed to a method of processing a substrate, the method comprising: (a) depositing a dielectric layer comprising a dielectric material on a substrate; (b) removing a portion of the dielectric layer to form a dielectric structure, thereby exposing a surface of the substrate; (c) forming an oxide layer on the exposed surface of the substrate; and (d) removing the oxide layer.

Another embodiment of the invention is directed to a method of processing a substrate, the method comprising: (a) depositing a dielectric layer comprising a metal oxide on a substrate comprising silicon; (b) removing a portion of the dielectric layer to form a dielectric structure, thereby exposing a surface of the substrate; (c) forming an oxide layer on the exposed surface of the substrate using ozone generated using ultraviolet radiation and embedding remnant metal on the exposed surface of the substrate within the oxide layer; and (d) removing the oxide layer and the remnant metal using an etching process.

Other embodiments of the invention are directed to products made by methods according to embodiments of the invention.

These and other embodiments of the invention are described in further detail below.

DETAILED DESCRIPTION

Figure 1:
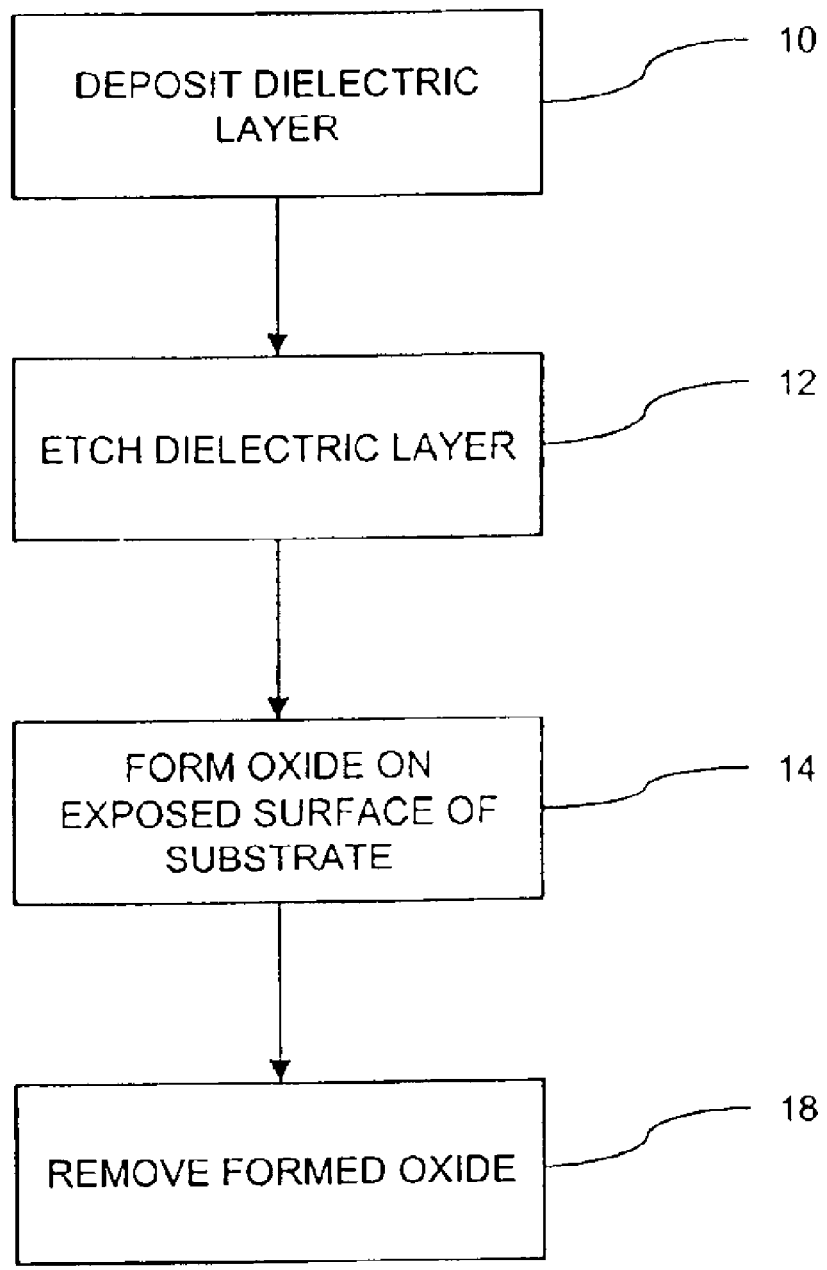
FIG. 1 shows a flowchart of a method according to an embodiment of the invention.

Embodiments of the invention are directed to methods for processing substrates. FIG. 1 illustrates some of the steps according to an embodiment of the invention. Referring to FIG. 1, the method comprises depositing a dielectric layer on a substrate comprising, for example, silicon (step 10). The dielectric layer may comprise a metal oxide such as a metal silicate. After depositing the dielectric layer, a portion of the dielectric layer is removed to form a dielectric structure, thereby exposing a surface of the substrate. In some embodiments, the dielectric layer may be patterned to form a dielectric structure. Standard photolithographic techniques and etching can be used to form the dielectric structure (step 12). After etching, contaminants such as remnant metal from the dielectric layer may be left on and under the exposed surface of the substrate. An oxide layer is then formed on the exposed surface of the substrate (step 14). The oxide layer may be formed using ozone that is generated using ultraviolet radiation. The ozone can oxidize the exposed surface of the silicon substrate to form an oxide layer (e.g., a silicon oxide layer). Remnant metal at and beneath the exposed surface of the silicon substrate is incorporated in the forming oxide layer. After the oxide layer is formed, it is removed using an etching process (step 18). The oxide layer, as well as the remnant metal that is embedded in it, is removed from the substrate during the etching process. The substrate may then be rinsed after the oxide layer is removed. Steps 14 and 18 may be repeated as many times (e.g., 2 or 3 times) as desired to remove contaminants from the substrate.

Each of the above noted steps will be described in further detail with reference to FIGS. 2(a)–2(d). In these FIGS., the various illustrated elements may be sized for clarity of illustration, and may not be to scale.

Figure 2A:
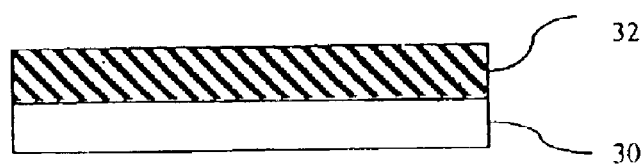
FIGS. 2(a)–2(d) shows schematic illustrations of a substrate as it is being processed according an embodiment of the invention.

Referring to FIG. 2(a), a dielectric layer 32 is first formed on a substrate 30. The dielectric layer 32 may be deposited as a continuous blanket layer that substantially covers the upper surface of the substrate 30. Any suitable process may be used to deposit the dielectric layer 32. Exemplary processes include vapor deposition processes such as CVD (chemical vapor deposition), PECVD (plasma enhanced chemical vapor deposition), and PVD (physical vapor deposition). Other deposition processes such as sol-gel processes could also be used to deposit a dielectric layer.

The substrate 30 may have any suitable characteristics. For example, the substrate 30 may be in any suitable form, and can include one or more sublayers. In some embodiments, the substrate 30 may be a single silicon substrate such as a silicon wafer. Alternatively, the substrate 30 could have one or more sublayers. For instance, the substrate 30 may be a silicon wafer with one or more patterned metal and dielectric layers on it. The substrate 30 may also comprise any suitable material. Preferably, the substrate 30 comprises a semiconductor such as silicon, gallium arsenide, etc. In embodiments of the invention, the upper surface of the substrate 30 is oxidizable.

The dielectric layer 32 may also have any suitable characteristics. For example, the dielectric layer 32 may comprise any suitable dielectric material. Preferably, the dielectric layer 32 comprises a metal oxide. Metal oxides include metal silicates such as $HfSi_xO_y$ and $ZrSi_xO_y$ (wherein x>0 and y>0). The metal oxide may alternatively comprise Group IIIA and IIIB metal oxides. Other examples of other metal oxides include $Al_2O_3$, $Y_2O_3$, $La_2O_3$, $Ta_2O_5$, $HfO_2$, and $ZrO_2$. Yet other examples include $Dy_3O_3$, $Gd_2O_3$, $Yb_2O_3$, $La_2O_3$, $Pr_2O_3$, $Sm_2O_3$, $Eu_2O_3$, and $Lu_2O_3$. Other suitable materials for the dielectric layer 32 may comprise dielectric materials such as silicon oxynitride or silicon nitride. Yet other suitable materials include rare earth oxides and oxynitrides. The dielectric layer 32 may also have any suitable thickness. For example, in some embodiments, the dielectric layer 32 may be less than about 10 nanometers thick (e.g., about 2–5 nanometers thick).

If desired, the dielectric layer 32 (or after a patterned dielectric layer is formed from the dielectric layer 32) may be annealed after it is deposited on the substrate 30. For example, the dielectric layer 32 can be subjected either to rapid thermal annealing (RTA) or standard furnace annealing in an $N_2$ atmosphere. The annealing process may be part of a subsequent dopant activation process that is used to create a transistor. The annealing times and temperatures used may be selected by the person of skill in the art.

Figure 2B:
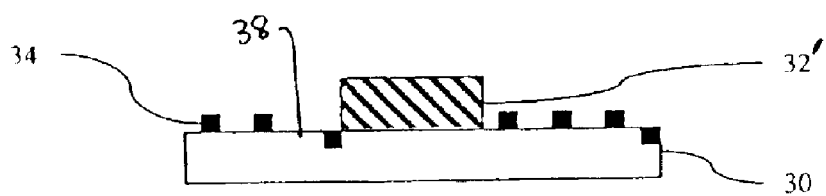

As shown in FIG. 2(b), a dielectric structure 32' is formed on the substrate 30 and from the dielectric layer 32. The dielectric structure 32' can be formed using a standard photolithography and etch process. For example, a photoresist layer (not shown) can be patterned on the dielectric layer 32 shown in FIG. 2(a) in a manner corresponding to the pattern of the dielectric structure 32'. Areas that are not covered by the photoresist pattern (not shown) can be etched using a suitable etchant to form the dielectric structure 32'. The resulting dielectric structure 32' is shown in FIG. 2(b). Areas where portions of the dielectric layer 32 are removed exposes the surface 38 of the substrate 30.

The dielectric structure 32' may have any suitable configuration and pattern. It may be used in conjunction with other elements, to form any suitable electronic device. For example, the dielectric structure 32' may be a gate dielectric structure for a transistor. In another example, the dielectric structure 32' may be a dielectric medium in a capacitor or a dielectric medium that separates conductive lines in an electrical circuit. Accordingly, the dielectric structure may have any suitable intended use.

As shown in FIG. 2(b), contaminants 34 are left on the exposed surface 38 of the substrate 30. The contaminants 34 may come from the removed portions of the dielectric layer 32. For example, if the dielectric layer 32 comprises a metal oxide, metal from the metal oxide may be left on the exposed surface of the substrate 30. If the substrate 30 and the dielectric structure 32' are subjected to a subsequent annealing process, the metal that is on the exposed surface of the substrate may become embedded under the exposed surface 38 (e.g., through diffusion). For example, as illustrated in the Examples section below, after forming a patterned layer of $ZrSi_xO_y$ on a silicon substrate, a Zr incorporation depth of up to 20 nm into the Si substrate was observed after annealing. Depth profiling shows that, although most of the remnant Zr after annealing/etching is located at or near the surface of the Si substrate, incorporation into the substrate is also present. This metal that is embedded within the substrate and/or on the surface of the substrate 30 may be referred to as "remnant" metal.

In other embodiments, the contaminants 34 may come from sources other than the dielectric material in the dielectric layer 32. For example, process materials such as process gases or a processing chamber may include contaminants that may inadvertently deposit on the exposed surface 38 of the substrate 30 during processing. Such contaminants 34, if present on the exposed surface 38 of the substrate 30, may also be removed using embodiments of the invention. Accordingly, the contaminants that can be removed using embodiments of the invention need not originate from the deposited dielectric layer 32.

In general, the total amount of metallic impurities on or near the surface of the substrate 30 is preferably less than about $10^{10}$ atoms/cm$^2$. The minimization of impurities on a silicon surface (after gate dielectric removal) reduces the likelihood of interdiffusion into the channel region (which could affect device performance). As illustrated in the examples below, embodiments of the invention can reduce the total amount of impurities on or near the surface of a substrate to be within the noted impurity range. As a result, reliable electrical devices using materials such as Zr and Hf silicates, for example, can be formed using embodiments of the invention, because contaminants such as remnant Zr and Hf can be effectively removed using embodiments of the invention.

Figure 2C:
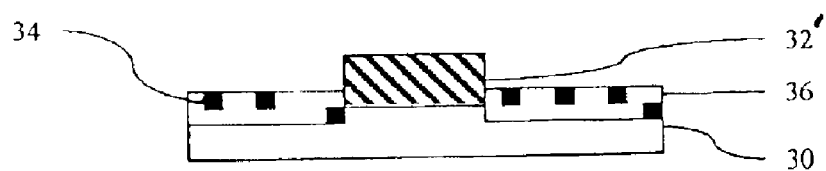

Referring to FIG. 2(c), after the dielectric structure 32' is formed, an oxide layer 36 is formed on the exposed surface 38 of the substrate 30. In the illustrated embodiment, the exposed surface 38 of the substrate 30 is oxidized. As shown in FIG. 2(c), as the oxide layer 36 is forming, the contaminants 34 are embedded in the oxide layer 36.

Any suitable oxidation process can be used. In preferred embodiments, ozone is used to oxidize the exposed surface 38 of the substrate 30. The ozone can be generated in any suitable manner. For example, ultraviolet radiation (e.g., from an Hg lamp) or a plasma can be used to generate ozone and this ozone can be directed to the exposed surface 38 of the substrate 30 to oxidize it. Any suitable process parameters may be used as long as an oxide layer 36 is formed. For instance, the substrate 30 could be exposed to UV generated ozone for between about 5 and about 30 minutes in some embodiments. In one example, the oxygen partial pressure in a reactor may be maintained at 500 Torr, and ultraviolet radiation can be used to generate ozone from the oxygen in the reactor for 30 minutes. In general, ozone generation is well known in the art.

Using ozone to oxidize the exposed surface 38 is desirable, because the oxidation process can be performed at low temperatures (e.g., ambient temperature). For instance, in embodiments of the invention, the substrate temperature may be between about 25° C. to about 100° C. At such low temperatures, the likelihood of damage to the substrate or any devices in the substrate due to excessive heating is minimized. The low temperature also minimizes the possibility of further diffusion of remnant impurities during the oxidation process.

Another advantage of using an oxidation process to form the oxide layer is that the oxide layer can be formed with a self-limiting thickness. In embodiments of the invention, part of the substrate material at the exposed surface 38 of the substrate 30 is consumed and reacts with oxygen to form the oxide layer 36. Once the oxide layer 36 is thick enough, the oxidation reaction with the substrate material will automatically stop. This can be desirable as embodiments of the invention can be performed with reproducible and predictable results.

Figure 2D:
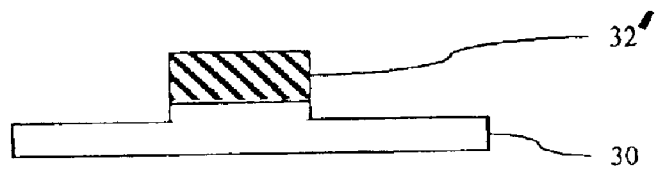

As shown in FIG. 2(d), after the oxide layer 36 is formed, the oxide layer 36 is removed. Contaminants 34 that were present in the oxide layer 36 are also removed from the substrate 30.

An etching process can be used to remove the oxide layer 36 from the substrate 30. The etching process can be a wet or a dry etching process. For example, to remove $SiO_2$ from a silicon wafer, the wafer can be dipped in an HF bath (e.g., a 49% HF bath). As an alternative, a vapor phase HF etching process could be used to remove the oxide layer 36. Other oxide etchants are known in the art.

After the oxide layer 36 is removed from the substrate 30, the substrate 30 can be rinsed. Deionized water or any other suitable liquid may be used to rinse the substrate 30. After rinsing, the substrate 30 has a clean, contaminant-free surface.

The oxidation/oxide removal cycle described above can be repeated any suitable number of times in order to remove additional embedded contaminants from the substrate 30. In some cases, a single oxidation/oxide removal cycle may be sufficient. In other cases, two or more oxidation/oxide removal cycles may be desirable.

Other specific embodiments of the invention are described in the Examples section below.

EXAMPLES $HfSi_xO_y$ and $ZrSi_xO_y$ films were formed on Si substrates (samples) according to the methods in M. A. Quevedo-Lopez, M. El-Bouanani, S. Addepalli, J. L. Duggan, B. E. Gnade R. M. Wallace, M. R. Visokay, M. Douglas, M. J. Bevan, and L. Colombo., Appl. Phys. Lett. 79 (2001) 2958. The films were annealed using RTA (rapid thermal annealing) and furnace annealing processes. To avoid artifacts during sputter depth profiling, and to facilitate accurate measurement of Hf or Zr diffusion profiles in the Si substrates, the annealed (RTA or furnace) films (either $HfSi_xO_y$ or $ZrSi_xO_y$) were removed using a CMOS grade 49% HF etchant. A 20 s etch duration in 49% HF was chosen for both as-deposited and annealed films to limit removal of the Si substrates to ≦0.3 nm. "Remnant" Zr or Hf concentration can be composed of two components: surface species (Hf, Zr) that remain after the etch process and incorporated species (Hf, Zr) from a thermally activated interdiffusion process. After etching, the substrates were rinsed 5 times in 18.2 MΩ deionized water for 5 min.

The following process was performed on some of the substrates:

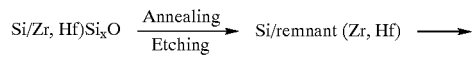

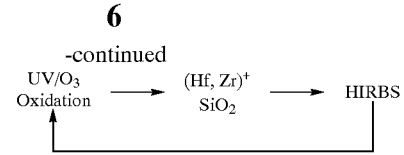

Following silicate removal by etching, each etched sample was exposed to UV/Ozone ($O_2$, 500 Torr) for 30 min to oxidize the surface of the silicon and also to embed remnant Zr or Hf in a $SiO_2$ matrix with a self-limiting thickness. The $MSiO_x$ (M=Hf or Zr) layer was subsequently removed by immersing the sample for 20 seconds in 49% HF. After the above process was performed, the samples were analyzed ex-situ with RBS (using $He^+$ and $Ar^+$ ions). By repeating this process, sub-nm depth profiling was achieved. Monochromatic and standard Al source X-ray Photoelectron Spectroscopy (XPS) and Time-of-Flight Secondary Ion Mass Spectrometry (ToF-SIMS) were also conducted on selected samples.

The depth profiling rests on the premise that oxide is grown with a reproducible thickness using a UV ozone oxidation process for every cycle. This growth can be dependent on substrate temperature, oxygen partial pressure and UV exposure time. The self-limiting and reproducible oxide growth was confirmed by measuring the oxide thickness after each cycle using X-ray photoelectron spectroscopy (XPS). The calculated $SiO_2$ thickness grown after the oxidation was about 0.65 nm (corresponding to about 0.29 nm Si substrate consumption). The etch time after each cycle (49% HF) was limited to 20 sec. This is enough time to remove the 0.65 mm $SiO_2$ while keeping the Si substrate removal to less than about 0.3 nm. A Si(100) etch rate in 49% HF of ~1 nm/min was assumed. Adding both contributors, 0.3 nm from the Si UV/Ozone oxidation and 0.3 nm from the HF etching, the total Si removal after each cycle was about 0.6 nm.

Typical Rutherford Backscattering Spectrometry (RBS) was conducted with 1.2 MeV $He^+$ ions with a scattering angle of 100° and a detection solid angle of $3.59 \times 10^{-3}$ sr. The angle between the beam direction and the normal to the sample was 35°. A 3.8 μm Mylar absorber was placed in front of the silicon detector to suppress the backscattered helium from the silicon substrate and to collect only the $He^+$ backscattered from Zr or Hf. The RBS data were collected using a $He^+$ beam intensity of 200 nA and an integrated charge of 165 μC. For enhanced sensitivity, heavy ion (HI-)RBS was conducted using 1.5 MeV $Ar^+$ ions. A scattering angle of 135° and 35° sample tilt was used. Although considerable radiation damage was not detected (<1% decrease in the calculated concentration after two consecutive measurements in the same samples), each cycle was carried out with new samples.

Figure 3:
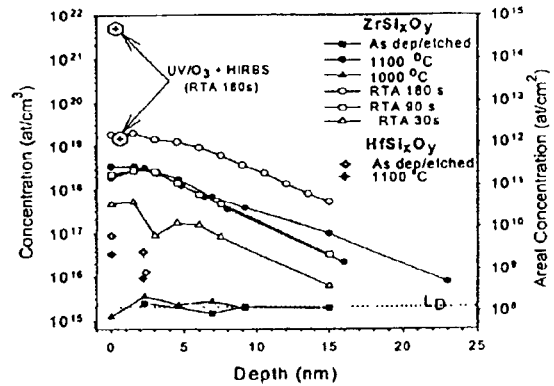
FIG. 3 shows ToF-SIMS of as-deposited and annealed/etched Zr and Hf silicate dielectric films. No detectible Hf incorporation for furnace-annealing temperatures lower that 1100° C. is observed. Apparent Zr incorporation is detected up to depths of ~24 nm into the silicon substrate. Areal concentration assumes a 0.5 nm sampling depth. The dashed line corresponds to $L_{D,TOF-SIMS}=2\times10^{15}/cm^3$ (detection limit).

ToF-SIMS measurements of the Zr and Hf distribution (without any UV/Ozone exposure) were conducted in the annealed and etched films using the techniques described in M. A. Quevedo-Lopez, M. El-Bouanani, S. Addepalli, J. L. Duggan, B. E. Gnade R. M. Wallace, M. R. Visokay, M. Douglas, M. J. Bevan, and L. Colombo., Appl. Phys. Lett. 79 (2001) 2958 (see FIG. 3). In order to check the reproducibility of this approach, two different furnace annealed/etched (1100° C., 6 min.) films were tested. The results are also shown in FIG. 3 (solid line, filled circles). Highly reproducible results were obtained indicating Zr incorporation into silicon with decreasing concentrations with incorporation depths of ~16–23 nm. A similar trend for the furnace-annealed films is observed in RTA annealed films. Using simple infinite and semi-infinite source diffusion models, a diffusion coefficient $D_0 \sim 2 \times 10^{-15}$ cm²/s was estimated from these RTA profiles at 1050° C.

By integrating the ToF-SIMS profiles, lower metal concentrations were always observed when compared with RBS calculations. In order to further study the difference in ToF-SIMS and RBS remnant metal concentrations, the combination of HI-RBS and oxidation/etching cycles described above (FIG. 4) was carried out. Samples with the highest remnant metal after etching were selected for this analysis, i.e., RTA for 180 seconds at 1050° C., and furnace annealed at 1100° C. The remnant Zr was higher for the 180 second RTA films, as compared with the furnace annealed films. This was in good agreement with the ToF-SIMS data. After 0.6 nm Si substrate removal, the total remnant Zr concentration (by HI-RBS) decreases in both films. This is strong evidence that most of the remnant Zr is located at the Si surface. However, after 1.2 nm Si substrate removal, a remnant Zr concentration for 180 s RTA films was observed. This confirms that Zr was incorporated into the Si substrate. The Zr concentration for furnace-annealed films was below HIRBS $L_D$. ($L_{D, Zr} \sim 5 \times 10^{11}$ at/cm², $L_{D, Hf} \sim 1 \times 10^{11}$ at/cm²). ($L_D$ refers to the detection limit for a given analysis process.)

The present inventors compared the Zr concentration obtained with this approach with the Zr concentration observed by ToF-SIMS. It can be seen in FIG. 3 that the Zr concentration calculated with HI-RBS at the surface is higher compared with ToF-SIMS. It was noted that during ToF-SIMS analysis, there is a short (1 sec) 700 eV $O_2^+$ "pre-sputter" step, prior to crater formation. This pre-sputter likely removes much of the remnant Zr at the exposed Si surface. This would explain the lower surface concentrations evaluated by ToF-SIMS as compared with HI-RBS. No sputter clean processes were performed before HI-RBS analysis in the etched films (without any oxidation cycles). Therefore, with HI-RBS, the entire remnant Zr is detected, giving a higher concentration when compared with ToF-SIMS. However, the first UV/O₃ oxidation/etching cycle can be considered roughly equivalent to the pre-sputter cleaning in ToF-SIMS. Interestingly, after 1.2 nm removal, both ToFSIMS and HI-RBS show excellent agreement, in both the total amount of Zr incorporated into Si and in relative concentration of Zr in Si at a depth of about 1.2 nm. This also confirms the incorporation of Zr into the Si substrate after annealing.

The previous experiment confirms that there are two contributors to the total Zr detected by HI-RBS: remnant Zr at the Si surface and Zr incorporated into the Si substrate. By using regular (He⁺) RBS (or HI-RBS), it is not possible to distinguish contributions from Zr at the surface and Zr incorporated into the substrate at such shallow depths. However, by coupling HI-RBS with UV/O₃/etching cycles, it was possible to distinguish surface and near surface contributions. Profiling deeper into the Si substrate was not useful, because the remnant Zr (or Hf) concentration after the $2^{nd}$ cycle is below HIRBS $L_D$. The sensitivity was limited by the detector used in this study (Si surface barrier detector). Time of flight detection (with large detection solid angle) would lead to a lower (~10⁸ at/cm²) detection limit.

FIG. 3 also shows the ToF-SIMS results for Hf silicate. Contrary to Zr silicate, no detectable Hf is observed for depths >2.5 nm. Hf diffusion into silicon is possible upon thermal activation; however, it has been shown that the dominant diffusing species is silicon. If any interfacial silicide ($HfSi_2$ or $ZrSi_2$) is grown during the annealing conditions, it is likely to be removed by the etching solution, since such suicides are soluble in the HF solution used to remove the silicate or $SiO_2$ film. No Hf was detected by HI-RBS here.

Figure 5:
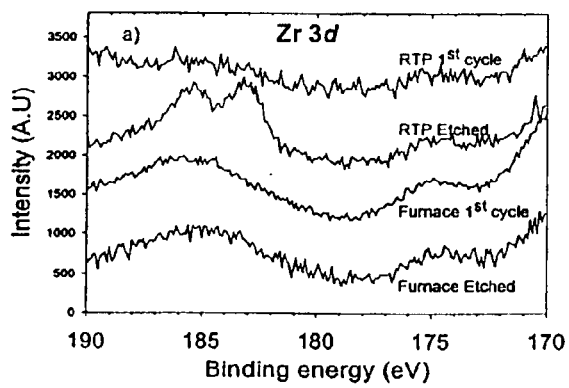
FIG. 5 shows a Zr 3d region for Zr silicate films after annealing and etching. After the first oxidation/etching cycle, no detectible Zr is observed.
Figure 6:
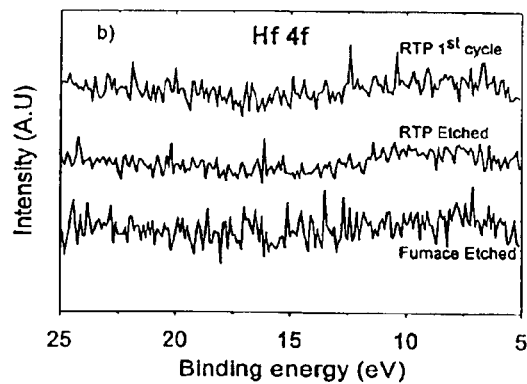
FIG. 6 shows a Hf 4f region for Hf silicate films after annealing and etching (no detectible Hf is observed after the film removal).

FIG. 5 shows the XPS results for Zr silicate films after 180 s RTA at 1050° C., and after 6 min at 1100° C. in a furnace annealing process, and after etching. A weak Zr feature was observed in the 180 s RTA annealed/etched film, indicating the presence of Zr in the near surface region (positioned upon a Si "shake-up" feature) and appears to coincide with the presence of remnant $ZrSi_xO_y$. It can be seen that, after the first oxidation/etching cycle, the remnant Zr is below limit of detection for XPS. This also confirms that most of the remnant Zr is within 0.6 nm of the silicon surface, and is in excellent agreement with HI-RBS results showed above. Si2p XPS analysis (not shown) for the as-deposited Hf-silicate film after etching shows only the Si2p feature for the silicon substrate and demonstrates an effective silicate removal (within $L_{D,XPS} \sim 2 \times 10^{13}$ Hf/cm² $\cong 0.5$ at. %). In the annealed/etched films, only the Si2p features from a thin remnant $SiO_x$ layer and the substrate are evident. FIG. 6 shows XPS results for Hf silicate films after annealing. Contrary to Zr silicate, no detectible Hf is observed by XPS, independent of the annealing time or temperature. This is in agreement with the HI-RBS results for Hf silicate films.

Table I below shows the remnant Zr and Hf concentrations evaluated by HI-RBS for RTA and furnace annealed Zr and Hf silicate after UV/Ozone+etching cycles. Generally, as-deposited films were easier to remove compared with the annealed films. As-deposited Hf-silicate was slightly harder to etch than the corresponding as-deposited Zr-silicate. Similar to ToF-SIMS, a direct relation with annealing time in RTA annealed films is observed for 30, 90, and 180 sec RTA films: after the first cycle (or 0.6 nm Si substrate removal) no Zr is detected. This again indicates a high contribution from remnant Zr at the Si surface. However, Zr incorporation after 30 and 90 second annealing can not be excluded based upon RBS, since $L_{D,HIRBS}$ of ~10¹¹ at/cm² is much higher compared with $L_{D,TOF-SIMS} \sim 2 \times 10^8$ at/cm². In fact, Zr incorporation after these annealing steps is evident from ToF-SIMS results (see FIG. 3). Since no Zr was detected by ToF-SIMS for 1000° C. furnace annealed films, the Zr observed by HI-RBS is attributed to remnant Zr at the Si surface.

TABLE I

Remnant Zr and Hf evaluated by HIRBS after UV/Ozone + etching cycles

| | $ZrSi_xO_y$ | | | $HfSi_xO_y$ | |
|---|---|---|---|---|---|
| | Etched | 1st Cycle | 2nd Cycle | Etched | 1st Cycle |
| As deposited | $L_D$ | — | — | $5 \times 10^{11}$ | — |
| RTP-180 | $3 \times 10^{14}$ | $9 \times 10^{11}$ | $7 \times 10^{11}$ | $L_D$ | — |
| RTP-90 | $7 \times 10^{13}$ | $L_D$ | — | $L_D$ | — |
| RTP-30 | $8 \times 10^{12}$ | $L_D$ | — | $L_D$ | — |
| F.A. 1100 | $1 \times 10^{13}$ | $1 \times 10^{12}$ | $L_D$ | $5 \times 10^{11}$ | — |
| F.A. 1000 | $5 \times 10^{12}$ | — | — | $L_D$ | — |
| F.A. 900 | $L_D$ | — | — | $L_D$ | — |

Table I shows more data on the unexpected results provided by embodiments of the invention. "$L_D$" and "—" indicate that the concentration of at/cm² was either at or below the detection limit, respectively.

Figure 4:
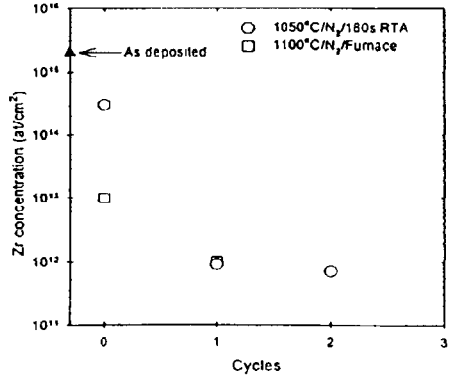
FIG. 4 shows a graph showing remnant Zr evaluated by HIRBS after UV/Ozone cycles.

Contrary to Zr-silicate, no detectible Hf was observed after RTA annealing of Hf-silicate films. Some Hf is detected in the as deposited and 1100° C. furnace annealed films. The Hf detected in the as-deposited films (see Table I) is clearly from remnant surface Hf after etching. The Hf observed in the furnace annealed films is also attributed to remnant Hf at the Si surface, since no Hf incorporation (see FIG. 3) is observed in the 1100° C. films, and also because no Hf incorporation is detected after the 1st UV/Ozone cycle (FIG. 4).

Also, as shown in Table I, the amount of Zr and Hf observed after annealing significantly decreases after one or two UV/ozone cycles are performed. For example, in the "RTP-180" example, detectable remnant Zr decreased from $3 \times 10^{14}$ at/cm$^2$ to $9 \times 10^{11}$ at/cm$^2$ after a first cycle of UV/ozone, and then to $7 \times 10^{11}$ at/cm$^2$ after a second cycle. In another example, for "RTP-90", detectable remnant Zr decreased from $7 \times 10^{13}$ at/cm$^2$ to below the detection limit $L_D$.

Figure 7:
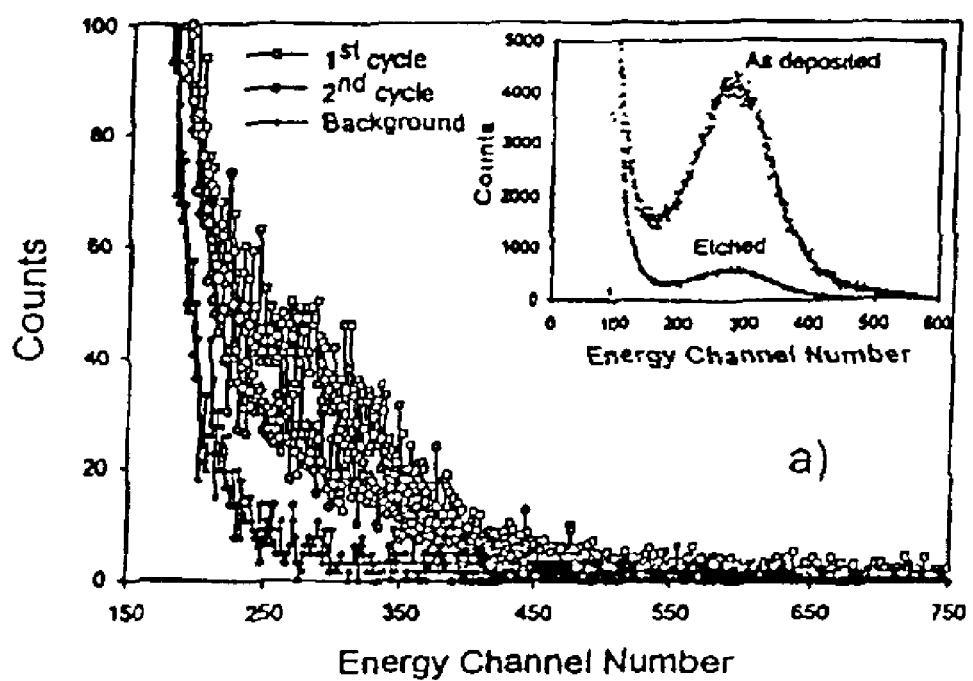
FIG. 7 shows a 1.5 MeV Ar+ RBS spectra showing remnant Zr silicate removal using embodiments of the invention.

FIG. 7 shows a 1.5 MeV Ar+ RBS spectra showing remnant Zr silicate removal using embodiments of the invention. As shown in FIG. 7, the presence of Zr decreases with each successive processing cycle using the above described UV/ozone oxidation and removal process.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A method of processing a substrate, the method comprising:
   (a) depositing a dielectric layer comprising a metal oxide dielectric material on a substrate;
   (b) removing a portion of the dielectric layer to form a dielectric structure, thereby exposing a surface of the substrate with remnant metal;
   (c) forming an oxide layer on the exposed surface of the substrate and the remnant metal, said forming step comprising oxidation to a predetermined depth with UV generated ozone; then
   (d) removing the oxide layer and remnant metal contained therein to said predetermined depth by an etching process.

2. The method of claim 1 wherein the substrate comprises a semiconductor substrate.

3. The method of claim 1 wherein the dielectric material comprises a metal oxide wherein the metal is selected from the group consisting of hafnium, zirconium, Group IIIA metals and Group IIIB metals.

4. The method of claim 1 wherein the subtrate comprises silicon.

5. The method of claim 1 wherein (b) removing the portion of the
   dielectric layer comprises patterning a photoresist layer to form a patterned
   photoresist layer on the dielectric layer, etching the portion of the dielectric layer to the substrate to expose the surface of the substrate, and removing the patterned
   photoresist layer.

6. The method of claim 1 further comprising rinsing the substrate after (d).

7. The method of claim 1 wherein the dielectric structure is a gate dielectric structure.

8. The method of claim 1 wherein the dielectric material
   comprises a silicate and the oxide layer is formed to about 0.65 nm into the substrate containing the remnant metal.

9. The method of claim 1 further comprising annealing the dielectric layer and the substrate.

10. A method of processing a substrate, the method comprising:
    (a) depositing a dielectric layer comprising a metal oxide on a substrate comprising silicon;
    (b) removing a portion of the dielectric layer to form a dielectric structure, thereby exposing a surface of the substrate, thereby leaving remnant metal on and under the surface of the substrate;
    (c) forming an oxide layer to a predetermined depth on the exposed surface of the substrate using ozone generated using ultraviolet radiation and embedding the remnant metal within the oxide layer; and
    (d) removing the oxide layer and the remnant metal using an etching process; then repeating forming step (c) and removing step (d).

11. The method of claim 10 wherein (b) removing the portion of the dielectric layer comprises patterning a photoresist layer on the dielectric layer, and etching the portion of the dielectric layer to the substrate to expose the surface of the substrate.

12. The method of claim 10 wherein the dielectric structure is a gate dielectric structure.

13. The method of claim 10 wherein the dielectric structure is a dielectric medium in a capacitor.

14. The method of claim 10 further comprising annealing the dielectric layer and the substrate.

* * * * *